United States Patent
Hwang et al.

(10) Patent No.: US 12,490,555 B2
(45) Date of Patent: Dec. 2, 2025

(54) DISPLAY DEVICE USING SEMICONDUCTOR LIGHT-EMITTING ELEMENT AND MANUFACTURING METHOD THEREOF

(71) Applicant: LG ELECTRONICS INC., Seoul (KR)

(72) Inventors: Sunghyun Hwang, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 429 days.

(21) Appl. No.: 17/794,381

(22) PCT Filed: Jan. 29, 2020

(86) PCT No.: PCT/KR2020/001328
§ 371 (c)(1),
(2) Date: Jul. 21, 2022

(87) PCT Pub. No.: WO2021/149856
PCT Pub. Date: Jul. 29, 2021

(65) Prior Publication Data
US 2023/0047241 A1 Feb. 16, 2023

(30) Foreign Application Priority Data
Jan. 22, 2020 (KR) .................. 10-2020-0008869

(51) Int. Cl.
*H10H 20/831* (2025.01)
*H01L 25/075* (2006.01)
*H10H 20/01* (2025.01)

(52) U.S. Cl.
CPC ..... *H10H 20/8314* (2025.01); *H01L 25/0753* (2013.01); *H10H 20/01* (2025.01); *H10H 20/032* (2025.01)

(58) Field of Classification Search
CPC ......... H01L 25/0753; H01L 2933/0016; H01L 33/005; H01L 33/0093; H01L 33/0095;
(Continued)

(56) References Cited

U.S. PATENT DOCUMENTS

2010/0276726 A1   11/2010   Cho et al.
2011/0037051 A1   2/2011   Lin et al.
(Continued)

FOREIGN PATENT DOCUMENTS

EP   2249406   11/2010
EP   2816617   12/2014
(Continued)

OTHER PUBLICATIONS

Korean Intellectual Property Office Application No. 10-2020-008869, Office Action dated Jul. 22, 2024, 3 pages.
(Continued)

*Primary Examiner* — Matthew C Landau
*Assistant Examiner* — Dmitriy Yemelyanov
(74) *Attorney, Agent, or Firm* — LEE, HONG, DEGERMAN, KANG & WAIMEY

(57) ABSTRACT

A display device, according to an embodiment of the present invention, comprises a semiconductor light-emitting element, the semiconductor light-emitting element comprising: a first conductive electrode; an undoped semiconductor layer formed on the first conductive electrode; a first conductive semiconductor layer formed on the undoped semiconductor layer; an active layer formed on the first conductive semiconductor layer; a second conductive semiconductor layer formed on the active layer; and a second conductive electrode formed on the second conductive semiconductor layer; wherein the first conductive electrode is formed to cover a part of a side surface of the first conductive semiconductor layer.

8 Claims, 18 Drawing Sheets

(58) Field of Classification Search
CPC ..... H01L 33/145; H01L 33/24; H01L 33/385; H01L 33/44
See application file for complete search history.

(56) References Cited

U.S. PATENT DOCUMENTS

| | | | | |
|---|---|---|---|---|
| 2012/0001218 | A1* | 1/2012 | Choi | H10H 20/817 257/E33.068 |
| 2014/0367717 | A1 | 12/2014 | Freund et al. | |
| 2016/0197232 | A1 | 7/2016 | Bour et al. | |
| 2017/0170360 | A1 | 6/2017 | Bour et al. | |
| 2020/0251451 | A1* | 8/2020 | Schuele | H01L 33/486 |

FOREIGN PATENT DOCUMENTS

| | | |
|---|---|---|
| KR | 10-2007-0105577 | 10/2007 |
| KR | 10-2008-0074363 | 8/2008 |
| KR | 10-2010-0120026 | 11/2010 |
| KR | 20130025457 A * | 3/2013 |
| KR | 10-2013-0125871 | 11/2013 |
| KR | 10-2014-0146989 | 12/2014 |
| KR | 10-2017-0048066 | 5/2017 |
| KR | 10-2017-0100611 | 9/2017 |
| KR | 10-2018-0089771 | 8/2018 |
| KR | 10-2019-0121274 | 10/2019 |

OTHER PUBLICATIONS

PCT International Application No. PCT/KR2020/001328, International Search Report dated Oct. 22, 2020, 4 pages.
European Patent Office Application Serial No. 20915295.8, Search Report dated Feb. 1, 2024, 10 pages.
Korean Intellectual Property Office Application No. 10-2020-0008869, Notice of Allowance dated Feb. 19, 2025, 7 pages.

* cited by examiner

DISPLAY DEVICE USING SEMICONDUCTOR LIGHT-EMITTING ELEMENT AND MANUFACTURING METHOD THEREOF

CROSS-REFERENCE TO RELATED APPLICATIONS

This application is the National Stage filing under 35 U.S.C. 371 of International Application No. PCT/KR2020/001328, filed on Jan. 29, 2020, which claims the benefit of earlier filing date and right of priority to Korean Application No. 10-2020-0008869, filed on Jan. 22, 2020, the contents of which are all incorporated by reference herein in their entirety.

TECHNICAL FIELD

The present disclosure relates to a display device using a semiconductor light emitting diode and a method for manufacturing the same, and in particular, to a display device using a semiconductor light emitting diode having a size of several to several tens of µm and a method for manufacturing the same.

BACKGROUND ART

Recently, liquid crystal displays (LCD), organic light-emitting diode (OLED) displays, and micro LED displays are competing to implement a large-area display in the field of display technology.

Meanwhile, if a semiconductor light emitting diode (micro LED) having a cross-sectional area or diameter of 100 µm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in a fluid, and is the most advantageous method for realizing a large-screen display device.

The self-assembly includes a method of directly assembling a semiconductor light emitting diode on a final substrate to be used in a product, and a method of assembling a semiconductor light emitting diode on an assembled board and then transferring the semiconductor light emitting diode to a final substrate through an additional transfer process. The method of directly assembling on the final substrate is efficient in terms of process. The use of the assembled board has an advantage in that a structure for self-assembly can be added without limitation. Therefore, the two methods are selectively used.

DISCLOSURE

Technical Problem

An object of the present disclosure is to provide a vertical semiconductor light emitting diode having a size of several to several tens of µm capable of self-assembly, furthermore, a display device including the vertical semiconductor light emitting diode, and a method of manufacturing the display device.

Another object of the present disclosure is to provide a method of manufacturing a display device capable of variously manufacturing a rear structure of a semiconductor light emitting diode included in the display device.

Technical Solution

According to an embodiment of the present disclosure, in a display device including a semiconductor light emitting diode, the semiconductor light emitting diode includes a first conductivity type electrode; an undoped semiconductor layer formed on the first conductivity type electrode; a first conductivity type semiconductor layer formed on the undoped semiconductor layer; an active layer formed on the first conductivity type semiconductor layer; a second conductivity type semiconductor layer formed on the active layer; and a second conductivity type electrode formed on the second conductivity type semiconductor layer; in which the first conductivity type electrode is formed to cover a portion of a side surface of the first conductivity type semiconductor layer.

In the present embodiment, the semiconductor light emitting diode is formed so that the side surfaces of the first conductivity type semiconductor layer, the active layer, and the second conductivity type semiconductor layer have inclinations.

In the present embodiment, the first conductivity type semiconductor layer includes a first layer which includes one surface in contact with the active layer and has a side surface formed to have a first inclination; and a second layer which includes the other surface in contact with the undoped semiconductor layer and has a side surface formed to have a second inclination.

In the present embodiment, the first conductivity type electrode is formed to cover the side surface of the second layer.

In the present embodiment, the active layer is formed so that the side surface thereof has the same first inclination as the first layer.

In the present embodiment, the second conductivity type semiconductor layer is formed so that at least a portion of the side surface thereof has the same first inclination as the first layer and the active layer.

In the present embodiment, the first conductivity type semiconductor layer includes a third layer which is disposed between the first layer and the second layer and has a side surface having a third inclination.

In the present embodiment, at least one of the first conductivity type electrode and the second conductivity type electrode includes a magnetic layer.

In the present embodiment, the semiconductor light emitting diode further includes a passivation layer formed to cover a side surface of the semiconductor light emitting diode and the second conductivity type electrode.

According to an embodiment of the present disclosure, a method for manufacturing a display device includes (a) forming an undoped semiconductor layer, a first conductivity type semiconductor layer, an active layer, a second conductivity type semiconductor layer, and a second conductivity type electrode on a growth substrate, and etching to a predetermined depth to form a plurality of semiconductor light emitting diodes; (b) forming a passivation layer on the growth substrate to cover the plurality of semiconductor light emitting diodes, and forming a sacrificial layer on the passivation layer; (c) attaching a transfer substrate to which the plurality of semiconductor light emitting diodes are to be transferred on the sacrificial layer; (d) separating the transfer substrate and the plurality of semiconductor light emitting diodes from the growth substrate; and (e) forming the first conductivity type electrode on one surface of the undoped semiconductor layer; in which the first conductivity type electrode is formed to cover a portion of a side surface of the first conductivity type semiconductor layer.

In the present embodiment, the method for manufacturing a display device further includes, before step (e), a step of etching a portion of the undoped semiconductor layer and the first conductivity type semiconductor layer.

In the present embodiment, the first conductivity type semiconductor layer includes a first layer which includes one surface in contact with the active layer and has a side surface formed to have a first inclination; and a second layer which includes the other surface in contact with the undoped semiconductor layer and has a side surface formed to have a second inclination.

Advantageous Effect

According to an embodiment of the present disclosure, the contact area of the rear electrode of the semiconductor light emitting diode can be formed in various ways by adjusting the etching degree of the undoped semiconductor layer and the first conductivity type semiconductor layer, and thus there is an effect that the amount of current and the light efficiency can be controlled.

BEST MODE

Figure 1:
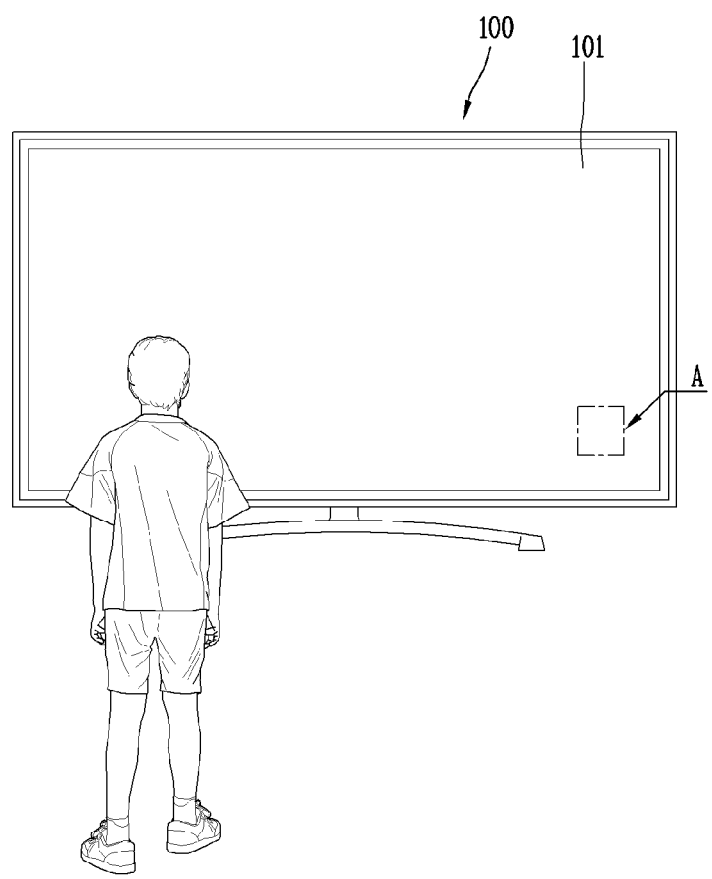
FIG. 1 is a conceptual diagram illustrating an embodiment of a display device using a semiconductor light emitting diode of the present disclosure.

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

Figure 2:
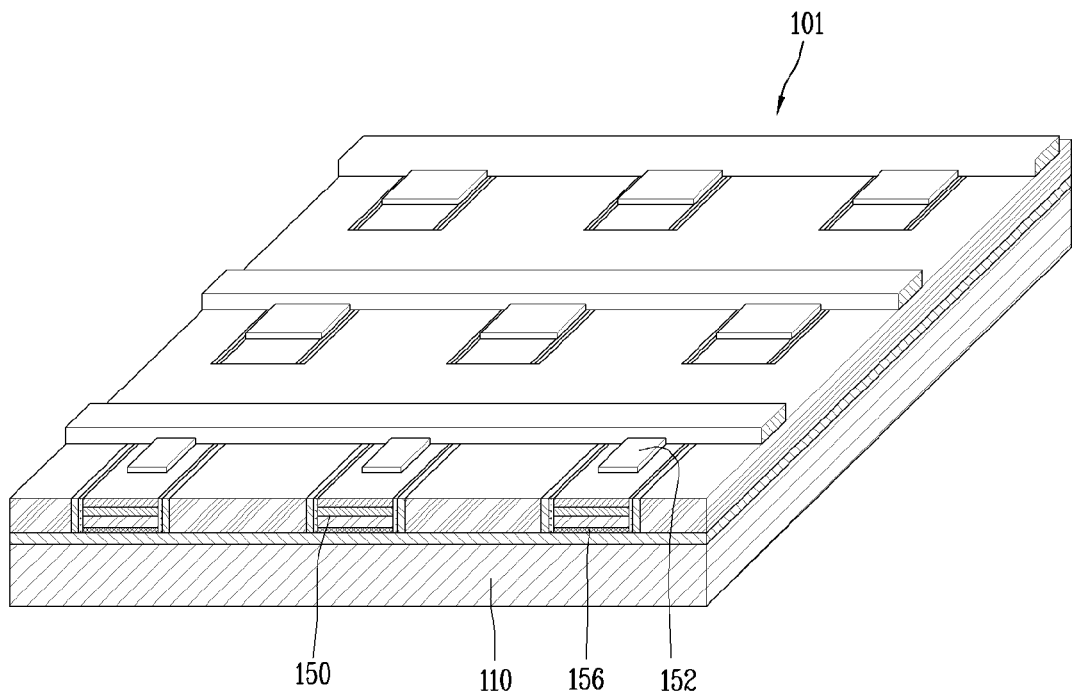
FIG. 2 is a partially enlarged view of portion A of the display device of FIG. 1.
Figure 3:
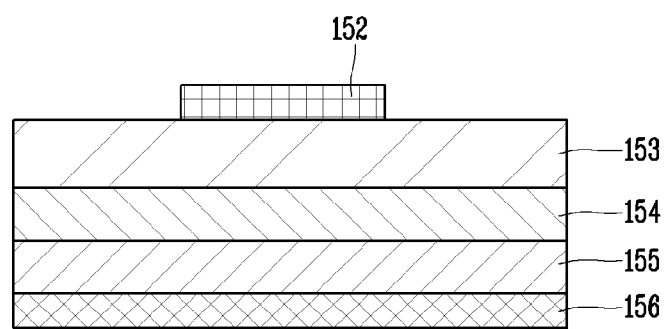
FIG. 3 is an enlarged view of the semiconductor light emitting diode of FIG. 2.
Figure 4:
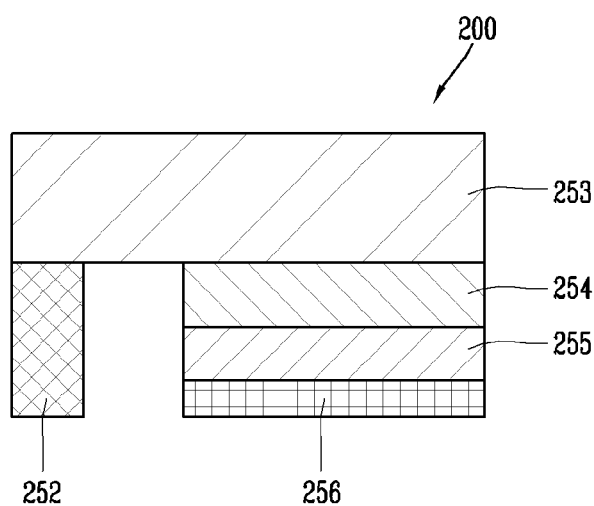
FIG. 4 is an enlarged view illustrating another embodiment of the semiconductor light emitting diode of FIG. 2.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5A to 5E are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

Figure 5A:
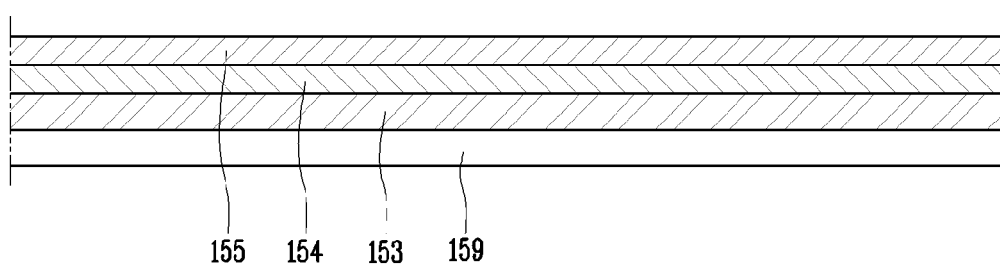
FIGS. 5A to 5E are conceptual views for describing a new process of manufacturing the semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154 and the second conductivity type semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Figure 5B:
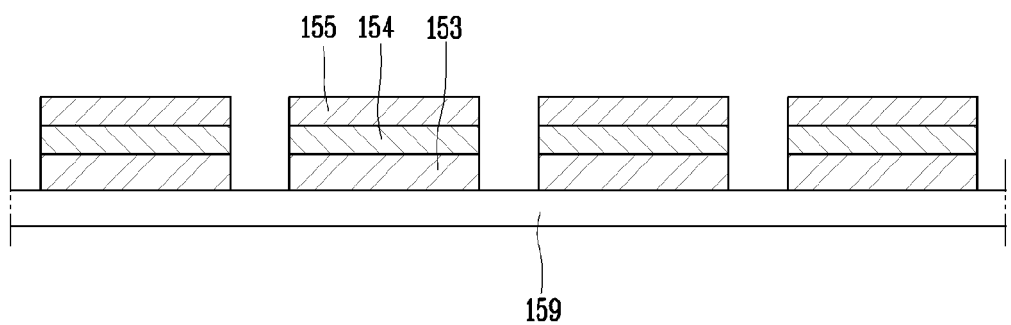

Next, at least a portion of the first conductivity type semiconductor layer 153, the active layer 154, and the second conductivity type semiconductor layer 155 are removed to form a plurality of semiconductor light emitting diodes (FIG. 5B).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Figure 5C:
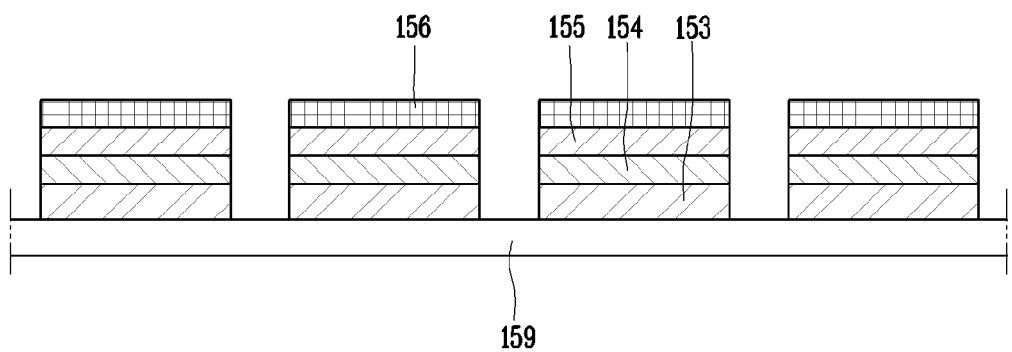

Next, second conductivity type electrodes 156 (or p-type electrodes) are formed on one surface of the second conductivity type semiconductor layer 155 (FIG. 5C). The second conductivity type electrode 156 may be formed by a deposition method such as sputtering, but the present disclosure is not limited thereto. However, when the first conductivity type semiconductor layer and the second conductivity type semiconductor layer are an n-type semiconductor layer and a p-type semiconductor layer, respectively, the second conductivity type electrode 156 may be an n-type electrode.

Figure 5D:
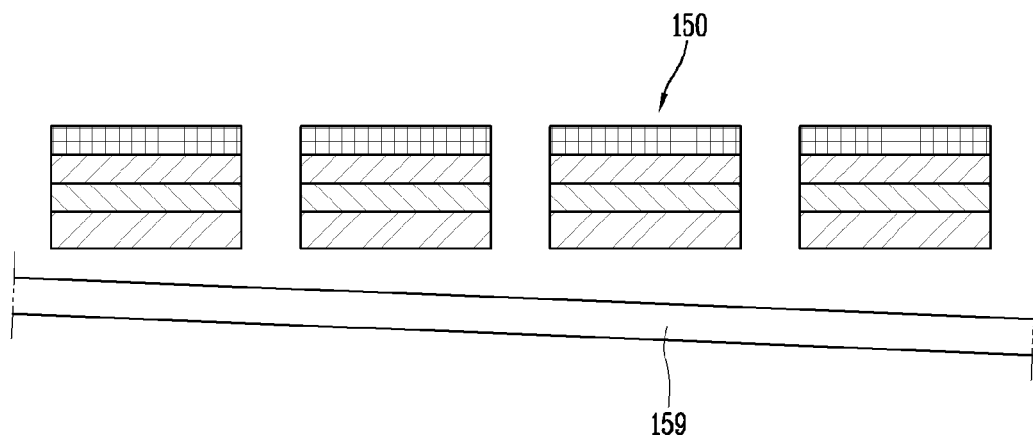

Then, the growth substrate 159 is removed to provide a plurality of semiconductor light emitting diodes. For example, the growth substrate 159 may be removed using a laser lift-off (LLO) method or a chemical lift-off (CLO) method (FIG. 5D).

Figure 5E:
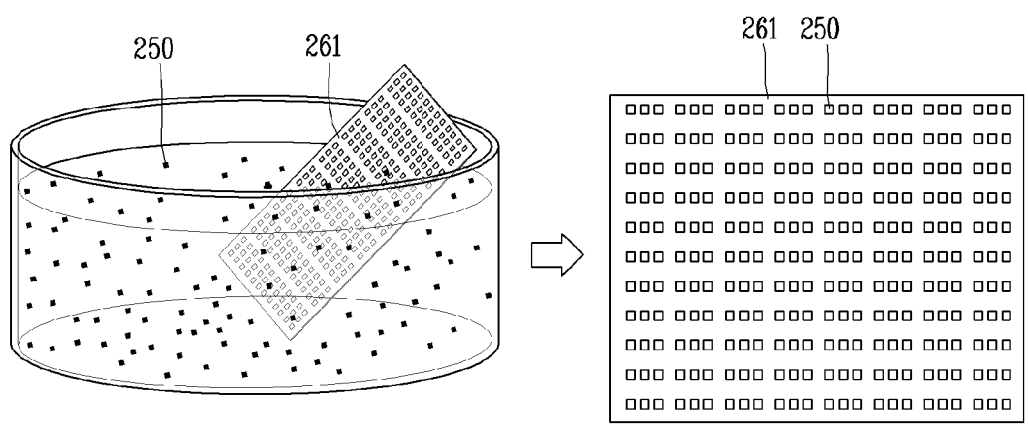

Thereafter, the semiconductor light emitting diodes 150 are seated on a board in a chamber filled with a fluid (FIG. 5E).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

Figure 6:
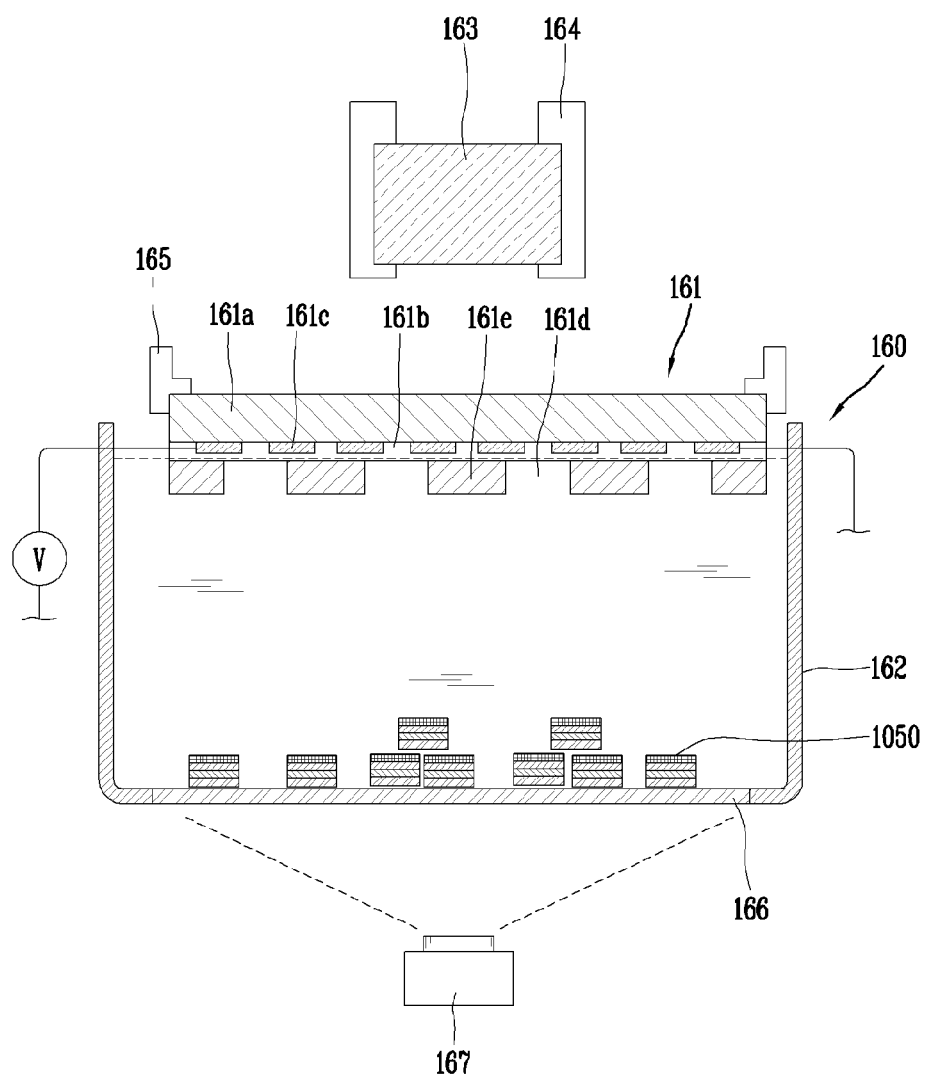
FIG. 6 is a conceptual diagram illustrating an example of a self-assembly apparatus of a semiconductor light emitting diode according to the present disclosure.
Figure 7:
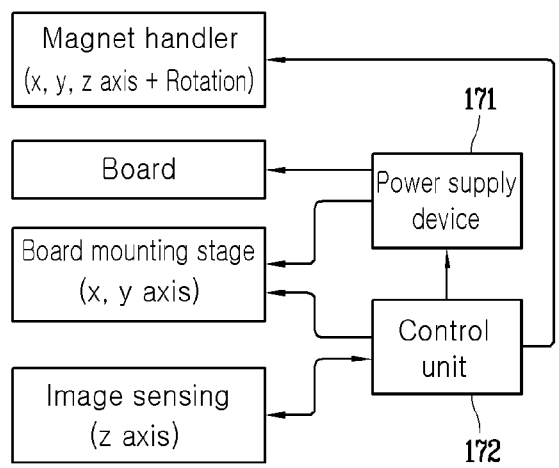
FIG. 7 is a block diagram of the self-assembly apparatus of FIG. 6.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several µm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Figure 8A:
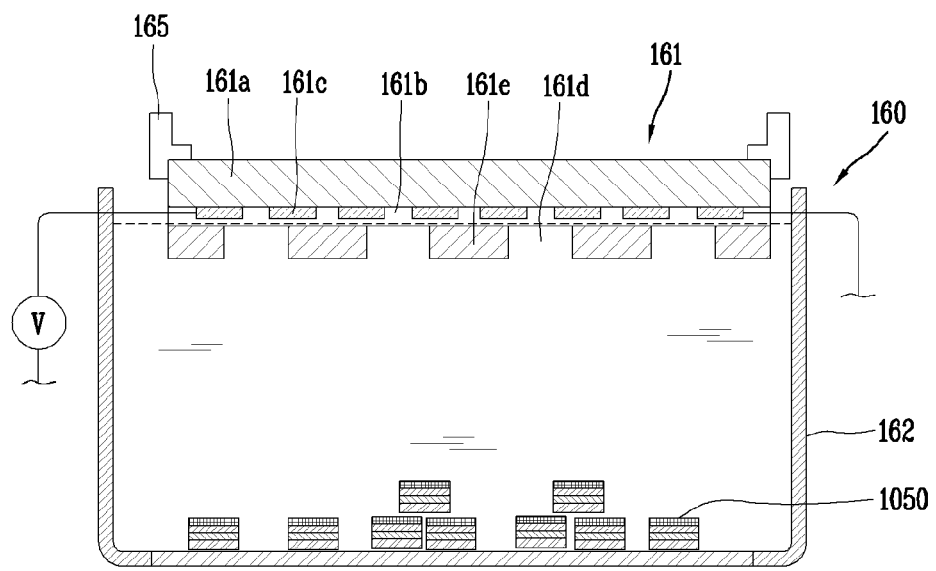
FIGS. 8A to 8E are conceptual views illustrating a process of self-assembling a semiconductor light emitting diode using the self-assembly apparatus of FIG. 6.
Figure 9:
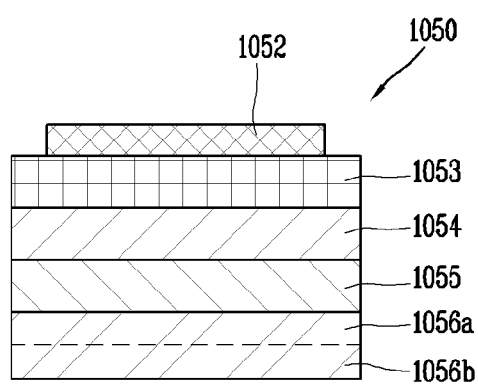
FIG. 9 is a conceptual diagram for describing the semiconductor light emitting diode of FIGS. 8A to 8E.

Next, the board 161 is transferred to an assembly position, and the semiconductor light emitting diodes 1050 are put into the fluid chamber 162 (FIG. 8A).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Figure 8B:
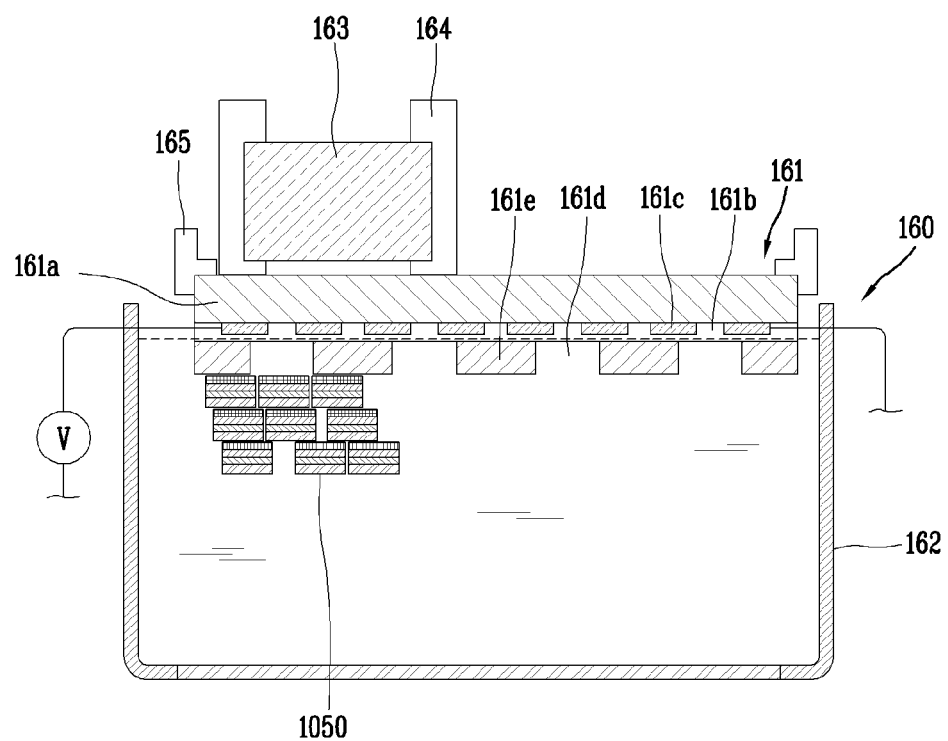

Next, a magnetic force is applied to the semiconductor light emitting diodes 1050 such that the semiconductor light emitting diodes 1050 vertically float in the fluid chamber 162 (FIG. 8B)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Figure 8C:
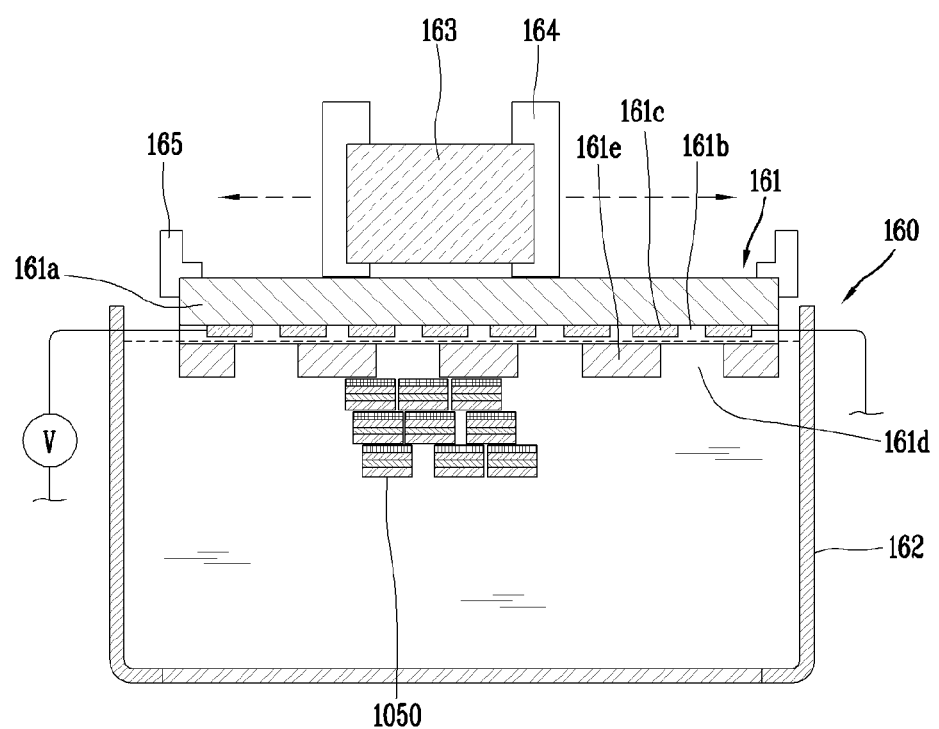

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8C). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8C). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Figure 8D:
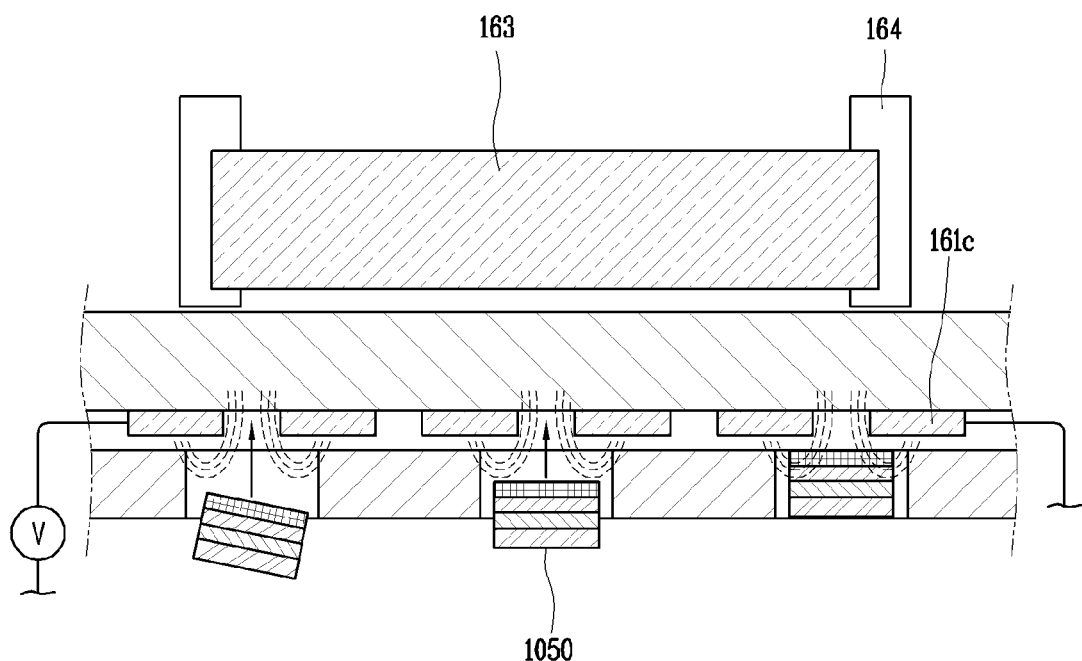
Figure 8E:
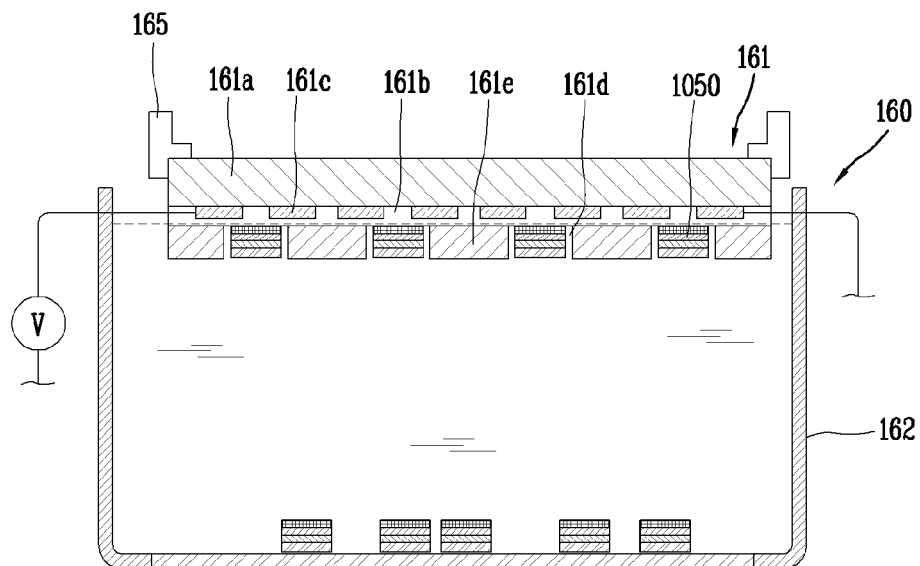

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8D). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Hereinafter, a display device using a semiconductor light emitting diode according to an embodiment of the present disclosure and a method manufacturing the same will be described with reference to the accompanying drawings.

A display device using a semiconductor light emitting diode according to an embodiment of the present disclosure may be implemented in a passive matrix (PM) method or an active matrix (AM) method.

The display device according to an embodiment of the present disclosure may include a substrate (not shown) and a vertical semiconductor light emitting diode 3000 having a size of several to several tens of μm capable of self-assembly.

The vertical semiconductor light emitting diode 3000 has an advantage in that the electrodes are disposed vertically, which is advantageous for miniaturization of the semiconductor light emitting diode 3000.

The substrate may be made of a flexible and insulating material for implementation of a flexible display and may include an assembled electrode for assembling a semiconductor light emitting diode and a wiring electrode electrically connected to the semiconductor light emitting diode.

In addition, the substrate may include a solder portion (not shown) for connecting the vertical semiconductor light emitting diode 3000 and the wiring electrode. The solder portion may be formed to have a melting point of 45° C. to 300° C., for example, among metals of Sn, Ag, Cu, Pb, Al, Bi, Cd, Fe, In, Ni, Sb, Zn, Co and Au, by adjusting the composition of one or more elements or an eight-component based composition, the melting point of the solder portion may be adjusted.

First, a structure of a semiconductor light emitting diode according to an embodiment of the present disclosure will be described with reference to FIGS. 10 to 13.

Figure 10:
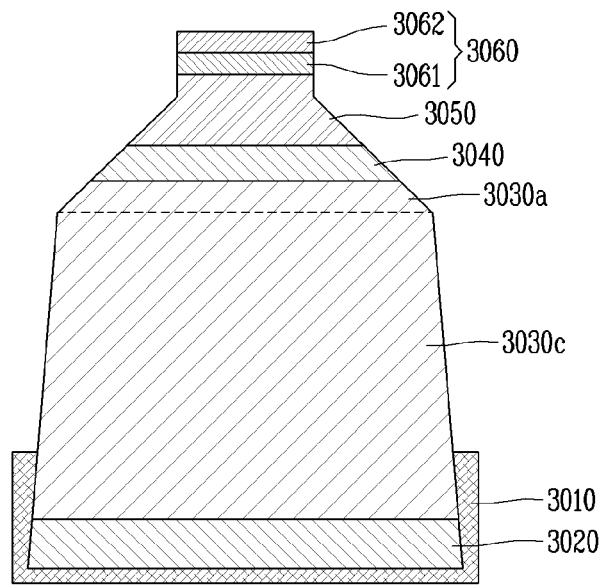
FIG. 10 is a conceptual diagram showing a structure of a semiconductor light emitting diode according to an embodiment of the present disclosure.
Figure 11:
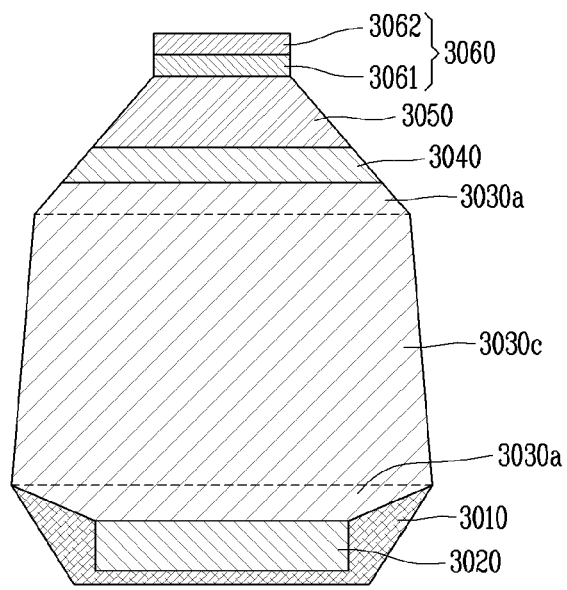
FIGS. 11 to 13 are conceptual diagrams showing a structure of a semiconductor light emitting diode according to another embodiment of the present disclosure.
Figure 12:
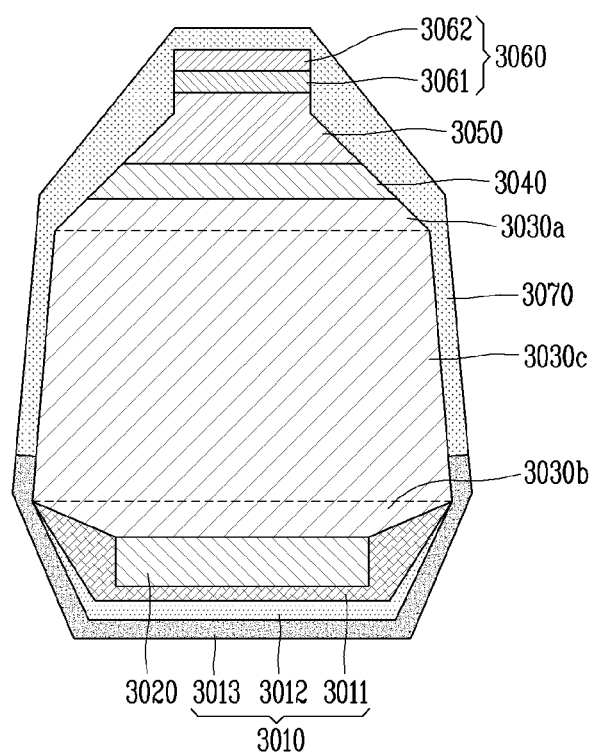
Figure 13:
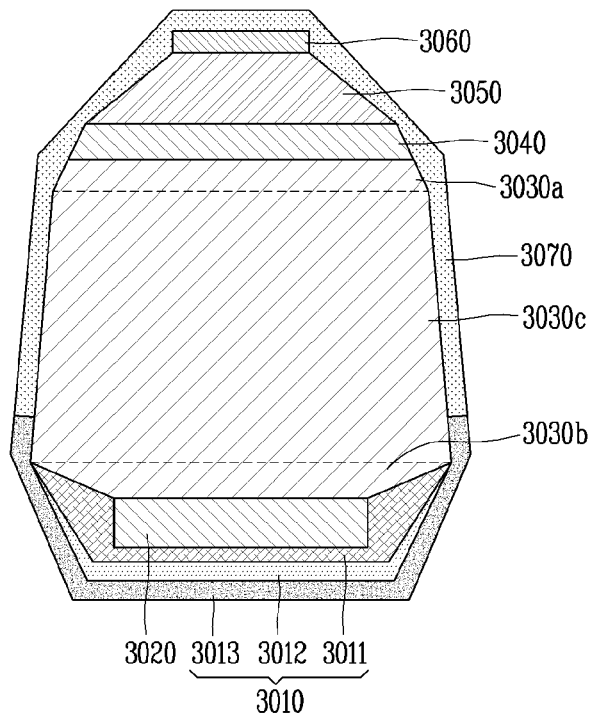

FIG. 10 is a conceptual diagram showing a structure of a semiconductor light emitting diode according to an embodiment of the present disclosure, and FIGS. 11 to 13 are conceptual diagrams showing a structure of a semiconductor light emitting diode according to another embodiment of the present disclosure.

Referring to FIG. 10, a semiconductor light emitting diode 3000 according to an embodiment of the present disclosure may include a first conductivity type electrode 3010, an undoped semiconductor layer 3020 formed on the first conductivity type electrode, a first conductivity type semiconductor layer 3030 formed on the undoped semiconductor layer 3020, an active layer 3040 formed on the first conductivity type semiconductor layer 3030, a second conductivity type semiconductor layer 3050 formed on the active layer 3040, and a second conductivity type electrode 3060 formed on the second conductivity type semiconductor layer 3050.

In this case, the first conductivity type electrode 3010 and the first conductivity type semiconductor layer 3030 may be an n-type electrode and an n-type semiconductor layer, respectively, and the second conductivity type electrode 3060 and the second conductivity type semiconductor layer 3050 may be a p-type electrode and a p-type semiconductor layer, respectively. However, the present disclosure is not necessarily limited thereto, and examples in which the first conductivity type is p-type and the second conductivity type is n-type are also possible.

Referring to FIG. 10, the first conductivity type electrode 3010 may be formed to extend to the side surface of the first conductivity type semiconductor layer 3030 to cover a portion of the side surface of the first conductivity type semiconductor layer 3030 and thus may be in contact with the first conductivity type semiconductor layer 3030.

In addition, the first conductivity type electrode 3010 may be electrically connected to the wiring electrode through a solder portion. In other words, the first conductivity type electrode 3010 may be an electrode for ohmic contact.

The first conductivity type electrode 3010 may optionally include a magnetic layer 3012. The magnetic layer 3012 includes a magnetic material (for example, Ni, Ti, or the like) and may allow the semiconductor light emitting diode 3000 to be easily induced by magnetic force during self-assembly.

As shown in FIGS. 12 and 13, when the first conductivity type electrode 3010 includes the magnetic layer 3012, the first conductivity type electrode 3010 may include a plurality of layers. For example, the first conductivity type electrode 3010 may have a form in which a first metal layer 3011, a magnetic layer 3012, and a second metal layer 3013 are sequentially stacked. In this case, the plurality of layers forming the first conductivity type electrode 3010 is not limited to the shape shown in the drawings.

Meanwhile, in the embodiment of the present disclosure, the second conductivity type electrode 3060 may be formed as a transparent electrode as the side from which the light generated in the active layer 3040 is emitted. For example, the second conductivity type electrode 3060 may be formed of indium tin oxide (ITO), indium zinc oxide (IZO), or the like.

In addition, the second conductivity type electrode 3060 may optionally include a magnetic layer 3062. The magnetic layer 3062 may include a magnetic material (for example, Ni, Ti, or the like) and may allow the semiconductor light emitting diode 3000 to be easily induced by magnetic force during self-assembly.

As shown in FIGS. 10 and 11, when the second conductivity type electrode 3060 includes the magnetic layer 3062, the second conductivity type electrode 3060 may include a plurality of layers. For example, the second conductivity type electrode 3060 may have a form in which the magnetic layer 3062 is stacked on the transparent electrode layer 3061, and the magnetic layer 3062 may be formed on the entire region or a partial region of the transparent electrode layer 3061.

According to an embodiment of the present disclosure, the semiconductor light emitting diode 3000 may include an undoped semiconductor layer 3020 on the first conductivity type electrode 3010. The undoped semiconductor layer 3020 may remain in the semiconductor light emitting diode 3000 by being partially etched during the manufacturing process of the semiconductor light emitting diode 3000.

According to an embodiment of the present disclosure, the first conductivity type semiconductor layer 3030, the active layer 3040, and the second conductivity type semiconductor layer 3050 may be formed so that side surfaces thereof have an inclination.

The first conductivity type semiconductor layer 3030 may be divided into a plurality of layers according to a lateral inclination. For example, the first conductivity type semiconductor layer 3030 may be divided into two or more layers having different inclinations.

The first conductivity type semiconductor layer 3030 may include one surface in contact with the active layer 3040 and the other surface in contact with a first layer 3030*a* having the side surface which is formed to have a first inclination and the undoped semiconductor layer 3020, and may include a second layer 3030*b* having the side surface which is formed to have a second inclination.

The second layer 3030*b* may be formed by etching a portion of the first conductivity type semiconductor layer 3030 together in the process of etching the undoped semiconductor layer 3020.

Meanwhile, the first conductivity type electrode 3010 formed to partially cover the side surface of the first conductivity type semiconductor layer 3030 may be formed to cover the side surface of the second layer 3030*b*.

In addition, the first conductivity type semiconductor layer 3030 may further include a third layer 3030*c* disposed between the first layer 3030*a* and the second layer 3030*b*, and having a third inclination.

Meanwhile, the side surface of the active layer 3040 may be formed to have the same first inclination as the first layer 3030*a* of the first conductivity type semiconductor layer 3030. Furthermore, the second conductivity type semiconductor layer 3050 may also be formed so that at least a portion of the side has the same first inclination as that of the first layer 3030*a*. Such various side inclined structures may be determined according to the mesa etch depth (or thickness) when the semiconductor light emitting diode 3000 is manufactured.

According to an embodiment of the present disclosure, the semiconductor light emitting diode 3000 may include a passivation layer 3070 formed to cover the side surface of the semiconductor light emitting diode 3000 and the second conductivity type electrode 3060. For example, the passivation layer 3070 may be formed of an inorganic insulating material such as $SiO_2$, or other insulating material.

Although not shown in the drawings, the passivation layer 3070 may cover a portion of the first conductivity type electrode 3010 extending to the side of the semiconductor light emitting diode 3000 while covering the side surface of the semiconductor light emitting diode 3000. However, the bottom surface of the first conductivity type electrode 3010 may be in an exposed state that is not covered by the passivation layer 3070 to enable ohmic contact.

In addition, the passivation layer 3070 may include a through-hole (not shown) exposing a portion of the second conductivity type electrode 3060. The through-hole may be filled with a conductive material, and thus the second conductivity type electrode 3060 may be connected to the wiring electrode through the through-hole.

The vertical semiconductor light emitting diode 3000 described above discloses a structure in which the first conductivity type electrode 3010 extends to the side of the semiconductor light emitting diode 3000, and there is an effect that the amount of current and light efficiency can be controlled by variously designing the shape of the rear electrode of the semiconductor light emitting diode 3000, that is, the first conductivity type electrode 3010.

Next, a method for manufacturing a display device including the above-described semiconductor light emitting diode 3000 will be described with reference to FIG. 14.

In particular, hereinafter, a method for manufacturing the semiconductor light emitting diode 3000, which is one configuration of the display device, will be mainly described.

FIGS. 14A to 14J are conceptual diagrams for explaining a process of manufacturing a semiconductor light emitting diode included in a display device according to an embodiment of the present disclosure.

According to an embodiment of the present disclosure, in order to manufacture the semiconductor light emitting diode 3000, (a) a step of forming an undoped semiconductor layer 3020, a first conductivity type semiconductor layer 3030, an active layer 3040, a second conductivity type semiconductor layer 3050, and a second conductivity type electrode 3060 on a growth substrate 4010 and etching to a predetermined depth to form a plurality of semiconductor light emitting diodes 3000 may be performed (FIG. 14a to 14d).

Figure 14A:
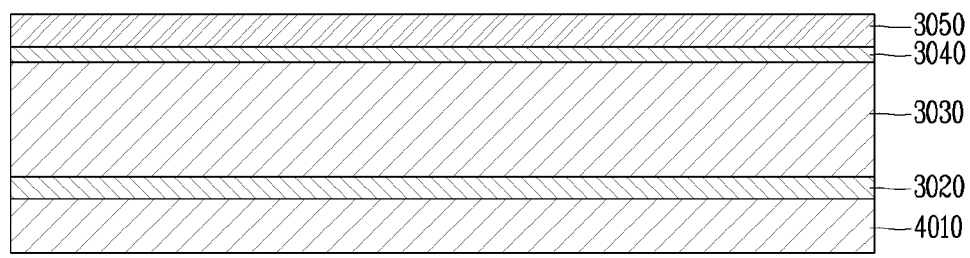
FIGS. 14A to 14J are conceptual diagrams for explaining a process of manufacturing a semiconductor light emitting diode included in a display device according to an embodiment of the present disclosure.

In detail, as shown in FIG. 14A, a step of sequentially growing the undoped semiconductor layer 3020, the first conductivity type semiconductor layer 3030, the active layer 3040, and the second conductivity type semiconductor layer 3050 on the growth substrate 4010 may be performed. The first conductivity type semiconductor layer 3030, the active layer 3040, and the second conductivity type semiconductor layer 3050 may be epitaxially grown on the growth substrate 4010.

For example, a sapphire substrate, a Si substrate, a SiC substrate, a GaP substrate, an InP substrate, or a GaAs substrate, or the like may be the growth substrate 4010, but the present disclosure is not limited thereto.

The undoped semiconductor layer 3020, the first conductivity type semiconductor layer 3030, and the second conductivity type semiconductor layer 3050 may be formed by mainly using GaN and adding In and/or Al together, and specifically, the first conductivity type semiconductor layer 3030 and the second conductivity type semiconductor layer 3050 may be doped with an n-type or p-type dopant, respectively. As described above, when the semiconductor layer may be formed by mainly using GaN, the semiconductor light emitting diode 3000 may emit green or blue light.

Alternatively, when the undoped semiconductor layer 3020, the first conductivity type semiconductor layer 3030, and the second conductivity type semiconductor layer 3050 are formed by mainly using GaInP and adding Al together, the semiconductor light emitting diode 3000 can emit red light. Hereinafter, a manufacturing method for an embodiment in which a GaInP-based semiconductor layer is grown on a GaAs substrate will be described.

Figure 14B:
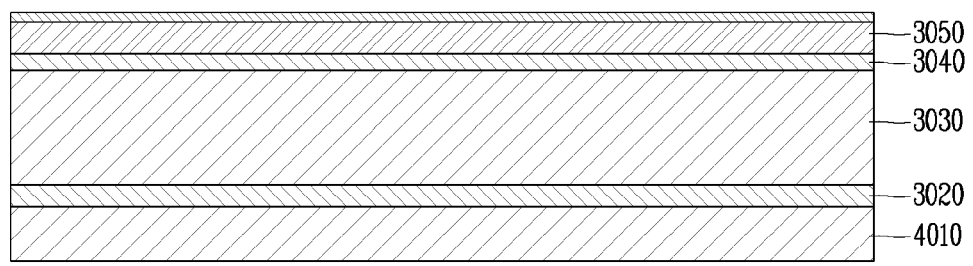

Thereafter, a step of depositing the second conductivity type electrode 3060 on the second conductivity type semiconductor layer 3050 may be performed. As shown in FIGS. 14B, the second conductivity type electrode 3060 may be deposited on the front surface of the second conductivity type semiconductor layer 3050. In addition, a transparent electrode such as indium tin oxide (ITO) or indium zinc oxide (IZO) may be used as the second conductivity type electrode 3060.

Figure 14C:
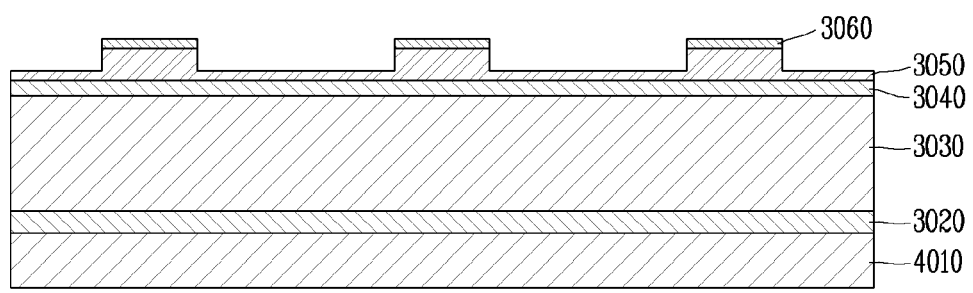

Thereafter, an etching step for mesa and isolation may be performed. The mesa etching may proceed up to a portion of the second conductivity type semiconductor layer 3050 or a portion of the first conductivity type semiconductor layer 3030, as shown in FIG. 14C.

Figure 14D:
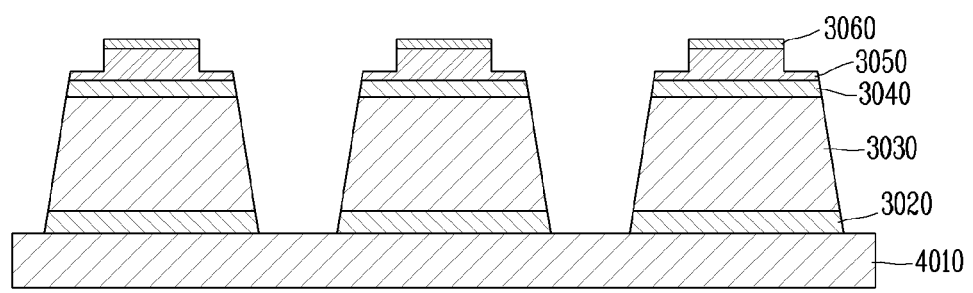

In addition, the isolation etching may be performed until the bottom surface of the growth substrate 4010 is exposed, as shown in FIG. 14D, whereby the plurality of semiconductor light emitting diodes 3000 may be isolated from each other.

The above-described mesa and isolation steps may be performed by dry etching, and etching may be performed after forming the PR mask pattern. In addition, in the corresponding step, the plurality of semiconductor light emitting diodes 3000 may be etched so that the side surface has a predetermined inclination.

Figure 14E:
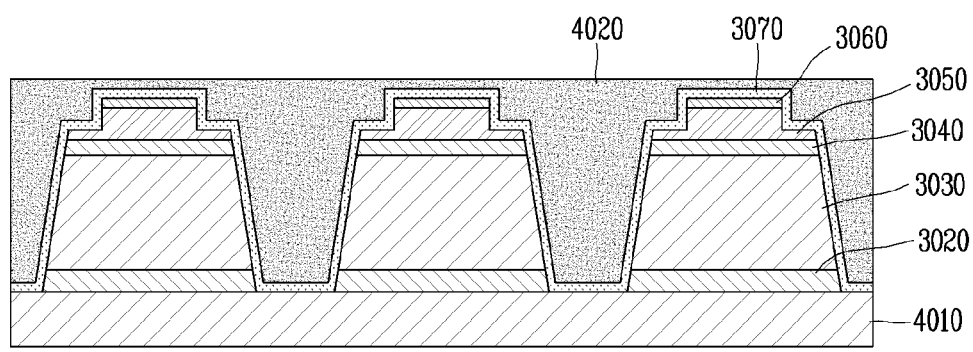

Next, (b) a step of forming a passivation layer 3070 on the growth substrate 4010 to cover the plurality of semiconductor light emitting diodes 3000 and forming a sacrificial layer 4020 on the passivation layer 3070 may be performed (FIG. 14E). For example, the sacrificial layer 4020 may be a layer in which PR is applied on a plurality of layers made of a metal, an adhesive, and an organic film. In addition, it is formed to fill a space between the plurality of semiconductor light emitting diodes 3000 and may be a layer for planarizing upper surfaces of the semiconductor light emitting diodes 3000.

Figure 14F:
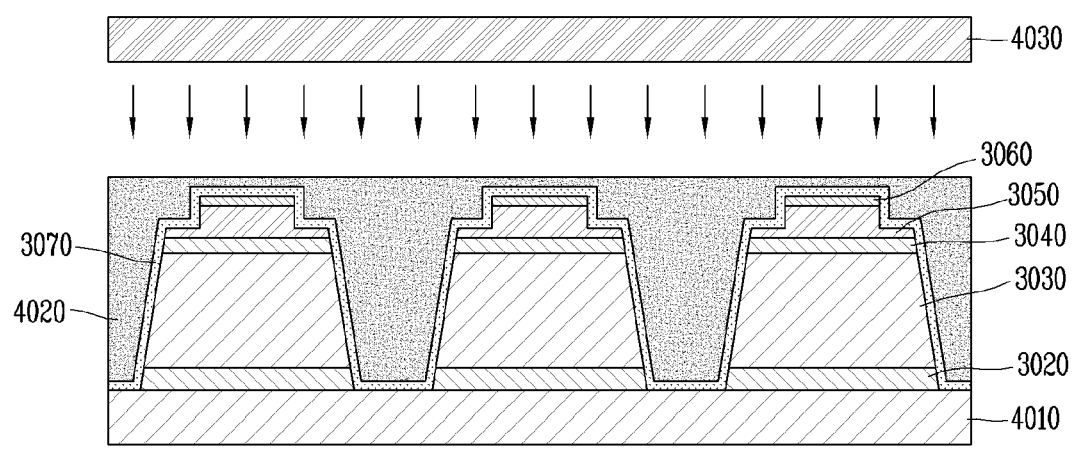

Next, (c) a step of attaching the transfer substrate 4030 to which the plurality of semiconductor light emitting diodes 3000 will be transferred on the sacrificial layer 4020 may be performed (FIG. 14F). This step may be performed by pressing the transfer substrate 4030 on the sacrificial layer 4020.

In this step, the transfer substrate 4030 may be a wafer-type rigid substrate such as glass and quartz, or a flexible film-type flexible substrate such as Polyimide (PI). In addition, the transfer substrate 4030 may have an adhesive material applied on its surface to be attached to the sacrificial layer 4020.

Figure 14G:
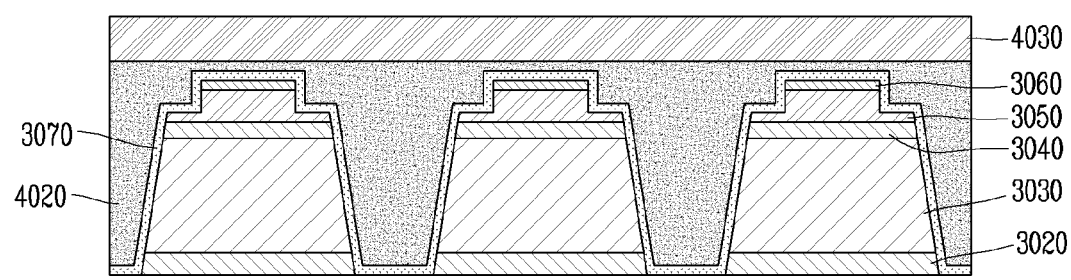

Next, (d) a step of separating the transfer substrate 4030 and the plurality of semiconductor light emitting diodes 3000 from the growth substrate 4010 may be performed (FIG. 14G). For example, in this step, a chemical lift-off (CLO) method may be used to separate the transfer substrate 4030 and the plurality of semiconductor light emitting diodes 3000 from the growth substrate 4010. An etchant may be selectively used according to a material forming the growth substrate 4010.

In addition, after the growth substrate 4010 is separated, a process of removing the passivation layer 3070 connecting the plurality of semiconductor light emitting diodes 3000 may be performed.

Figure 14H:
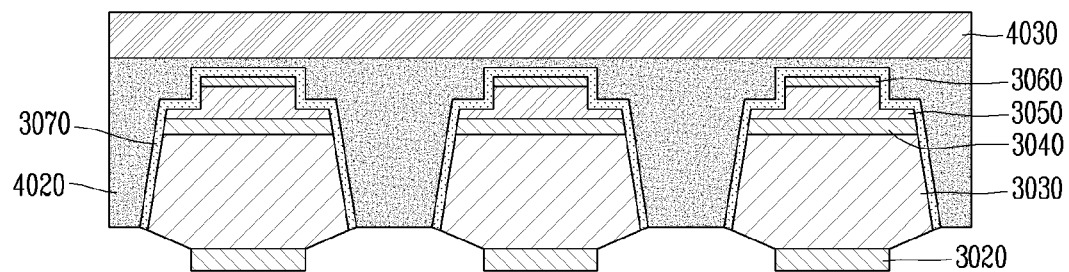
Figure 14I:
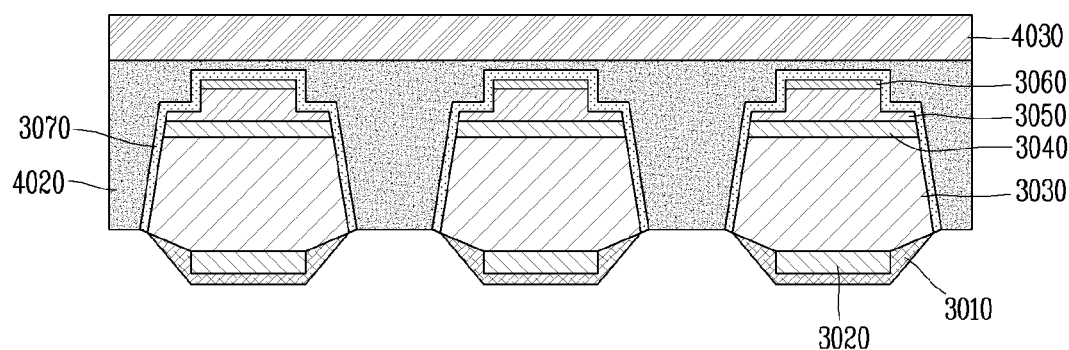
Figure 14J:
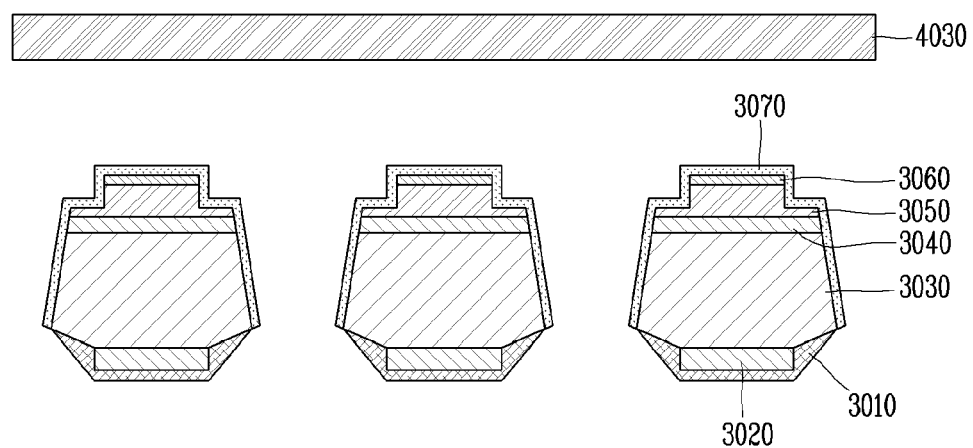

Finally, (e) a step of forming the first conductivity type electrode 3010 on one surface of the undoped semiconductor layer 3020 may be performed (FIG. 14I).

In detail, before the corresponding step, a step of etching a portion of the undoped semiconductor layer 3020 and the first conductivity type semiconductor layer 3030 may be performed (FIG. 14H). This step may be performed by forming a PR mask pattern on the undoped semiconductor layer 3020 and then selectively etching regions on the undoped semiconductor layer 3020 where the PR mask pattern is not formed and the first conductivity type semiconductor layer 3030.

Next, a step of forming the first conductivity type electrode 3010 on one surface of the undoped semiconductor layer 3020 may be performed. The first conductivity type electrode 3010 may include a magnetic layer 3012, or have a form in which a first metal layer 3011, a magnetic layer 3012, and a second metal layer 3013 are sequentially stacked.

The first conductivity type electrode 3010 may be formed to cover a portion of a side surface of the first conductivity type semiconductor layer 3030. In this case, a contact area with the first conductivity type semiconductor layer 3030 may be designed in various ways in consideration of the amount of current and light efficiency.

Meanwhile, through the step of etching a portion of the undoped semiconductor layer 3020 and the first conductivity type semiconductor layer 3030, the first conductivity type semiconductor layer 3030 may be divided into a plurality of layers having different inclinations.

The first conductivity type semiconductor layer 3030 may be divided into a first layer 3030a which includes one surface in contact with the active layer 3040 and has a side surface formed having a first inclination, and a second layer 3030b which includes the other surface in contact with the undoped semiconductor layer 3020 and has a side surface formed having a second inclination. The side inclination of the first layer 3030a may be formed in the mesa and isolation etching steps, and the side inclination of the second layer 3030b may be formed in the step of etching a portion of the undoped semiconductor layer 3020.

Thereafter, the semiconductor light emitting diodes 3000 may be separated from the transfer substrate 4030 by removing the sacrificial layer 4020 using an organic solvent, and the separated semiconductor light emitting diodes 3000 are introduced into the fluid chamber and can be assembled to a substrate through self-assembly.

Meanwhile, in a case of the manufacturing method for the embodiment in which a GaN-based semiconductor layer is grown on a sapphire substrate, the same process can be applied by changing some materials.

According to such a manufacturing method, by adjusting the etching degree of the undoped semiconductor layer 3020 and the first conductivity type semiconductor layer 3030, there is an effect of being able to design the shape of the back electrode of the semiconductor light emitting diode 3000 in various ways.

In addition, since only a portion of the undoped semiconductor layer 3020 is etched, damage to the semiconductor light emitting diode 3000 can be minimized compared to the case of manufacturing the semiconductor light emitting diode 3000 by etching the entire undoped semiconductor layer 3020.

The present disclosure described above is not limited to the configuration and method of the above-described embodiments, but the embodiments may be configured by selectively combining all or a portion of each of the embodiments so that various modifications can be made.

What is claimed is:

1. A display device comprising:
a semiconductor light emitting diode including:
a first conductivity type electrode;
an undoped semiconductor layer formed on the first conductivity type electrode;
a first conductivity type semiconductor layer formed on the undoped semiconductor layer;
an active layer formed on the first conductivity type semiconductor layer;
a second conductivity type semiconductor layer formed on the active layer; and
a second conductivity type electrode formed on the second conductivity type semiconductor layer;
wherein the first conductivity type electrode is formed to cover a portion of a side surface of the first conductivity type semiconductor layer,
wherein the second conductivity type electrode comprises a transparent electrode layer formed on the second conductivity type semiconductor layer and a magnetic layer formed on the transparent electrode layer,
wherein the second conductivity type electrode is transparent and includes an upper surface that emits light generated in the active layer, and
wherein the magnetic layer is formed to allow the semiconductor light emitting diode to be induced by magnetic force.

2. The display device of claim 1, wherein side surfaces of the first conductivity type semiconductor layer, the active layer, and the second conductivity type semiconductor layer are inclined.

3. The display device of claim 2, wherein the first conductivity type semiconductor layer includes:
a first layer in contact with the active layer and having a side surface formed to have a first inclination; and
a second layer in contact with the undoped semiconductor layer and having a side surface formed to have a second inclination.

4. The display device of claim 3, wherein the first conductivity type semiconductor layer further includes a third layer disposed between the first layer and the second layer and having a side surface formed to have a third inclination.

5. The display device of claim 3, wherein the first conductivity type electrode is formed to cover the side surface of the second layer.

6. The display device of claim 3, wherein a side surface of the active layer has a same inclination as the first inclination of the first layer.

7. The display device of claim 6, wherein at least a portion of a side surface of the second conductivity type semiconductor layer has the same inclination as the first inclination of the first layer and the active layer.

8. The display device of claim 1, wherein the semiconductor light emitting diode further includes a passivation layer formed to cover a side surface of the semiconductor light emitting diode and the second conductivity type electrode.

* * * * *